(12) United States Patent
Asano et al.

(10) Patent No.: US 7,986,087 B2
(45) Date of Patent: Jul. 26, 2011

(54) COLOR CONVERSION MEDIA AND EL-DISPLAY USING THE SAME

(75) Inventors: Masaaki Asano, Tokyo-To (JP); Koji Arai, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 1361 days.

(21) Appl. No.: 10/680,082

(22) Filed: Oct. 7, 2003

(65) Prior Publication Data

US 2004/0233139 A1 Nov. 25, 2004

(30) Foreign Application Priority Data

Oct. 8, 2002 (JP) ................................. 2002-294611

(51) Int. Cl.
*H01J 1/62* (2006.01)
*H01J 63/04* (2006.01)

(52) U.S. Cl. ........ 313/501; 313/498; 313/506; 313/112; 349/80; 349/104; 349/106

(58) Field of Classification Search .......... 313/498–512, 313/112; 349/80, 104, 106
See application file for complete search history.

(56) References Cited

U.S. PATENT DOCUMENTS

| | | | | |
|---|---|---|---|---|
| 5,909,081 A | * | 6/1999 | Eida et al. | 313/504 |
| 6,072,450 A | * | 6/2000 | Yamada et al. | 345/76 |
| 6,121,726 A | * | 9/2000 | Codama et al. | 313/504 |
| 6,450,635 B1 | * | 9/2002 | Okabe et al. | 347/106 |
| 6,512,504 B1 | * | 1/2003 | Yamauchi et al. | 345/87 |

FOREIGN PATENT DOCUMENTS

| | | |
|---|---|---|
| JP | 05-198379 | 8/1993 |
| JP | 06-308312 | 11/1994 |
| JP | 08-222369 | 8/1996 |
| JP | 09-245511 | 9/1997 |
| JP | 10-022073 | 1/1998 |
| JP | 10-162958 | 6/1998 |
| JP | 10-241860 | 9/1998 |

OTHER PUBLICATIONS

Jun. 29, 2009 Japanese Office Action issed in corresponding JP application with English Translation.

* cited by examiner

*Primary Examiner* — Nimeshkumar D Patel
*Assistant Examiner* — Thomas A Hollweg
(74) *Attorney, Agent, or Firm* — Harness, Dickey & Pierce, PLC (57) ABSTRACT

Disclosed is a color conversion member which is improved in the prevention of a deterioration in color conversion function, the prevention of reflection of external light, and color rendering properties. The color conversion member comprises a transparent substrate, two or more types of color conversion layers, and a color filter layer. The color conversion layers function to convert incident lights for respective pixels to outgoing lights of colors different from the incident lights. The two or more types of color conversion layers are arranged on said transparent substrate. The color filter layer is provided on the transparent substrate side of any one of the color conversion layers or between the above any one of the color conversion layers and the color conversion layers adjacent to the above any one the color conversion layers.

10 Claims, 4 Drawing Sheets

COLOR CONVERSION MEDIA AND EL-DISPLAY USING THE SAME

BACKGROUND OF THE INVENTION

1. Field of the Invention

The present invention relates to a color conversion media, especially a color conversion media for use in electroluminescent displays.

2. Background Art

In principle, electroluminescent (EL) elements have a structure comprising an EL layer at least sandwiched between an anode and a cathode. In practice, methods used for constructing EL displays using EL elements include (1) a method in which EL elements, which respectively emit lights of three primary colors, are arranged, (2) a method in which an EL element, which emits white light, is used in combination with color filter layers for three primary colors, and (3) a method (CCM[color conversion medium] method) in which an EL element, which emits for example blue light for example, is used in combination with a CCM layer for converting a blue color to a green color and a color conversion layer for converting a blue/green color to a red color.

In the method (3) [CCM method], the use of only an EL element, which emits a light having higher energy than light to be converted, suffices for contemplated purposes. Therefore, unlike the EL display according to the method (1), there is no need to have properties of EL elements for respective colors, and, in addition, unlike the EL display according to the method (2), there is no drawback that, in color separation using color filters for the three primary colors, the utilization efficiency of white light is low. The method (3) [CCM method] enhances the conversion efficiency of the CCM layer to improve the brightness of the display.

Luminophors used for constituting the color conversion layer for converting blue to green and the color conversion layer for converting blue/green to red sometimes, however, undergo a deterioration, for example, due to external light and excitation light leaked from the adjacent color conversion layer. The former problem, that is, the problem of the deterioration due to the external light can be overcome, for example, by the interposition of a color filter layer between the color conversion layer and the transparent substrate as a support or the application of a ultraviolet light shielding film onto the transparent substrate. On the other hand, other measures should be taken for overcoming the latter problem, that is, the deterioration due to the leaked excitation light or the like.

It has hitherto been often pointed out that, due to the fact that the thicknesses of the color conversion layers are larger than the thickness of a light shielding layer (hereinafter referred to as "black matrix") and vary from layer to layer, light incident to the color conversion layer having a relatively larger thickness causes scattering or the like and, leading to leakage of light to the adjacent color conversion layer. In order to prevent this phenomenon, Japanese Patent Laid-Open No. 241860/1998 proposes polishing the color conversion layers.

Even when the means, which polishes the color conversion layer together with the light shielding layer, is used, however, the final thicknesses of the color conversion layers should be made even. For this reason, due to the necessity of providing the light shielding layer in a thickness larger than the usually adopted thickness, the width of the light shielding layer should also be increased. Further, in forming the color conversion layers, in order to avoid mixing of mutually adjacent color conversion layer forming compositions, all the color conversion layers should be formed in a large height.

SUMMARY OF THE INVENTION

The present inventor has now found that, in color conversion members, the formation of the color conversion layers in a reduced thickness and the formation of the light shielding layer in a reduced thickness can facilitate the production of the color conversion member and, at the same time, can prevent a deterioration in color conversion function, can prevent the reflection of external light, and can improve color rendering properties. The present invention has been made based on such finding.

Accordingly, according to the present invention, there is provided a color conversion member comprising a transparent substrate, two or more types of color conversion layers, and a color filter layer, said color conversion layers functioning to convert incident lights for respective pixels to outgoing lights of colors different from the incident lights, said two or more types of color conversion layers being arranged on said transparent substrate, said color filter layer being provided on the transparent substrate side of any one of the color conversion layers or between said any one of the color conversion layers and the color conversion layers adjacent to said any one the color conversion layers.

DESCRIPTION OF REFERENCE CHARACTERS IN THE DRAWINGS

1: transparent substrate, 2: black matrix, 3: color filter layer, 4: color conversion layer, and 10: color conversion member.

DETAILED DESCRIPTION OF THE INVENTION

Embodiment Of The Invention

According to a first aspect of the present invention, there is provided a color conversion member for an EL display comprising a transparent substrate and two or more types of fine color conversion layers for converting incident lights for respective pixels to outgoing lights of colors different from the incident lights, said two or more types of fine color conversion layers being arranged on said transparent substrate, a fine color filter layer being provided at least on the transparent substrate side of any one type of the fine color conversion layers and between said any one of the color conversion layers and other types of fine color conversion layers adjacent to said any one of the fine color conversion layers, thereby forming a color conversion part.

In the color conversion member according to the first aspect of the present invention, in addition to the fine color filter layer provided on the transparent substrate side of said any one of the fine color conversion layers and between said any one of the fine color conversion layers and other types of fine color conversion layers adjacent to said any one the fine color conversion layers, a fine color filter layer may be provided on the transparent substrate side of at least one type of the other fine color conversion layers.

In the color conversion member according to the first aspect of the present invention, preferably, a black matrix having openings is provided on the transparent substrate and said fine color conversion layers are provided so as to correspond to the openings.

According to a second aspect of the present invention, there is provided a color conversion member in which, in the color conversion member according to the first aspect of the present invention, the color conversion layers are a first fine color conversion layer for converting incident light of blue color and green color to outgoing light of red color, a second fine color conversion layer for converting said incident light to outgoing light of green color, and a fine light transparent layer for transmitting said incident light as such, which are arranged on the transparent substrate, and a fine color filter layer for a red color is provided on the transparent substrate side of the first fine color conversion layer and between the first fine color conversion layer and other types of fine color conversion layers adjacent to the first color conversion layer.

In the color conversion member according to the second aspect of the present invention, a fine color filter layer for a green color is further provided at least on the fine light transparent layer side of the second fine color conversion layer.

According to a third aspect of the present invention, there is provided an EL display comprising the color conversion member according to any one of the above aspects of the present invention and a luminescent part comprising a transparent electrode layer, an EL layer, and a backside electrode layer, said luminescent part being provided, optionally through an overcoat, on the fine color conversion layers so as to correspond to each of the fine color conversion layers.

In the present invention, there is provided an EL display comprising the color conversion member according to the second aspect of the present invention and a luminescent part comprising a transparent electrode layer, an EL layer capable of emitting blue light and green light, and a backside electrode layer, said luminescent part being provided, optionally through an overcoat, on the fine color conversion layers so as to correspond to each of the fine color conversion layers.

According to a fourth aspect of the present invention, there is provided a process for producing a color conversion member comprising the steps of: determining one type of color conversion layer to be excluded as the fine color conversion layer, not to be first formed on a transparent substrate, from two or more types of fine color conversion layers for converting incident lights for respective pixels to outgoing lights of colors different from the incident lights, and forming and arranging the fine color conversion layers, except for the excluded color conversion layer, on the transparent substrate and forming a concave region on which the remaining one type of fine color conversion layer is to be formed; then applying a composition for fine color filter layer formation on the transparent substrate in its part, where the concave region has been formed, so that the composition is applied on the bottom and wall surface of the concave region, and solidifying the composition; applying a composition for the formation of the fine color conversion layer so that at least the concave region, in which the composition for fine color filter layer formation has been applied, is filled with the composition for fine color filter layer formation, and solidifying the composition; and then polishing the surface of the solidified products of both the compositions.

In the process according to the fourth aspect of the present invention, one type of color conversion layer to be excluded as the fine color conversion layer, not to be first formed on a transparent substrate, is determined from two or more types of fine color conversion layers for converting incident lights for respective pixels to outgoing lights of colors different from the incident lights, the fine color conversion layers, except for the excluded color conversion layer, are formed and arranged on the transparent substrate, and a concave region, on which the remaining one type of fine color conversion layer is to be formed, is formed. In this case, a fine color filter layer may be previously provided on the transparent substrate side of at least one of the formed two or more types of the fine color conversion layers.

In the process according to the fourth aspect of the present invention, after a black matrix having openings is first formed on the transparent substrate, the fine color conversion layer and the fine color filter layer are provided.

In the process according to the fourth aspect of the present invention, a method may be adopted wherein the application of the composition for the formation of the fine color filter layer onto the bottom and wall surface of the concave region and the solidification of the composition are carried out by photolithography, and a photomask which acts only on an area somewhat larger than the width of the concave region is utilized to provide the fine color filter layer on the bottom and wall surface within the concave region.

According to a fifth aspect of the present invention, there is provided a process for producing an EL display, comprising the steps of: producing the color conversion member by the process according to the fourth aspect of the present invention; optionally forming an overcoat on the fine color conversion layer; and then forming corresponding transparent electrode layer, organic EL layer, and backside electrode layer in that order on each of the fine color conversion layers.

Embodiments Of The Invention

Color Conversion Member and Production Process Thereof

Figure 1:
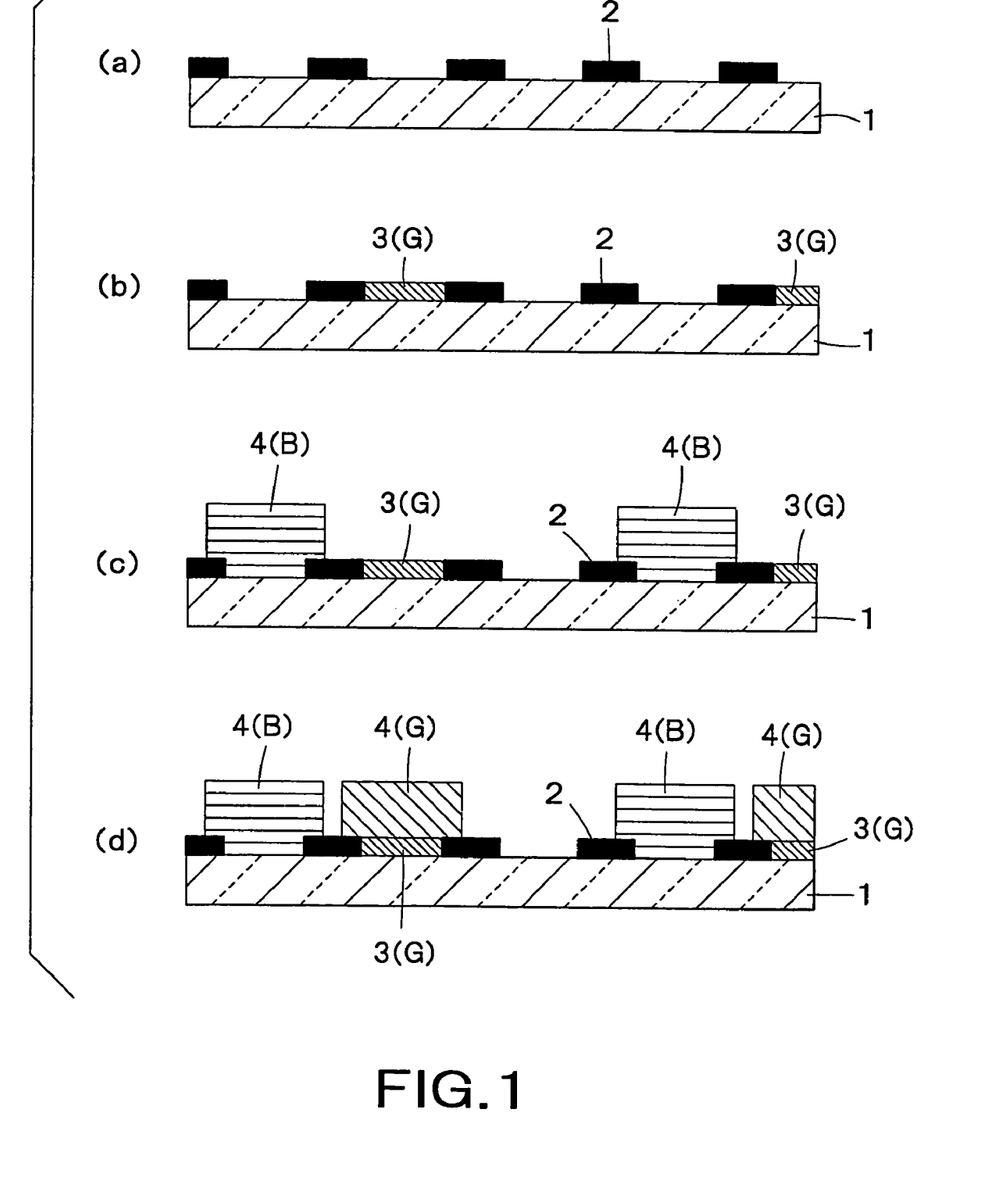
FIG. 1 a diagram showing a color conversion member and the first half of a production process thereof.
Figure 2:
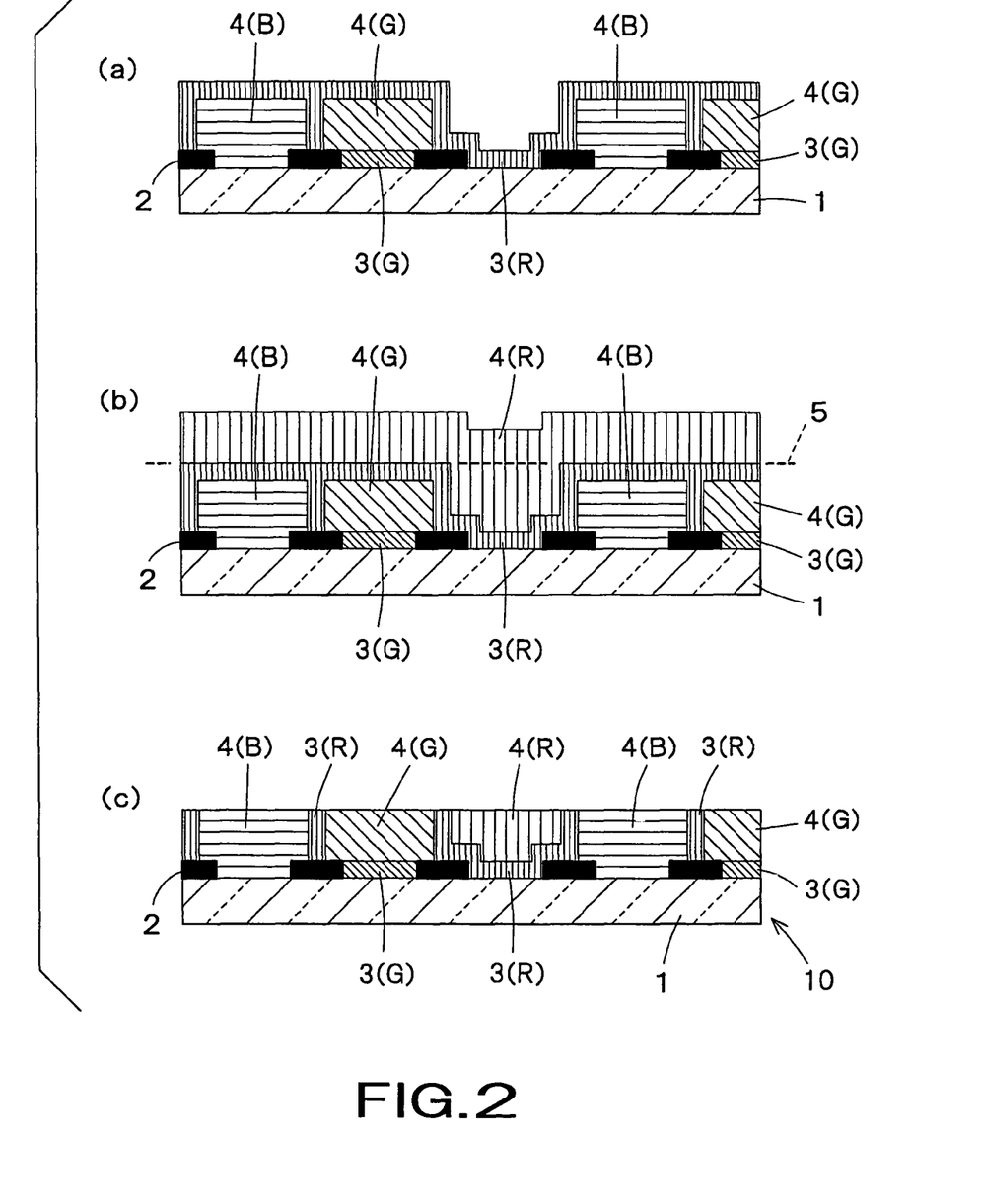
FIG. 2 is a diagram showing a color conversion member and the second half of a production process thereof.
Figure 3:
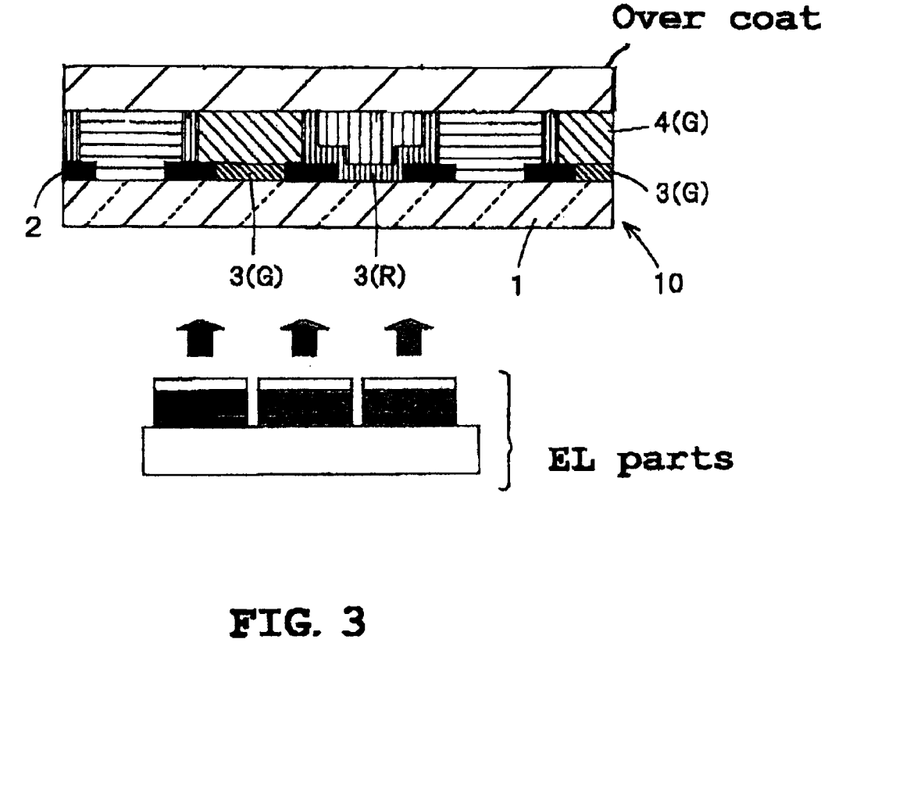
FIG. 3 is a diagram showing the color conversion layer in relation to el parts.
Figure 4:
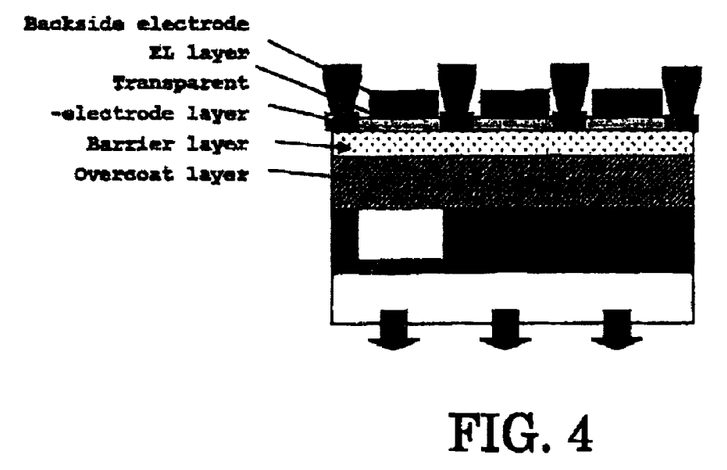
FIG. 4 is a diagram showing an exemplary relationship between varioius luminescent parts and the color conversion layer.
Figure 5:
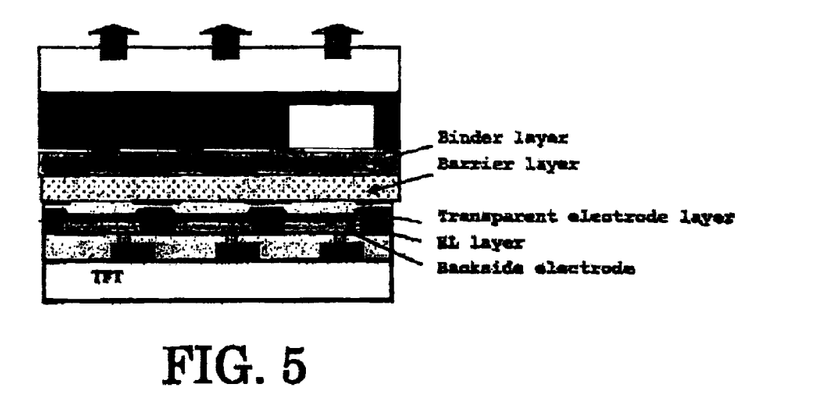
FIG. 5 is a diagram similar to FIG. 4, showing an alternative exemplary relationship.
Figure 6:
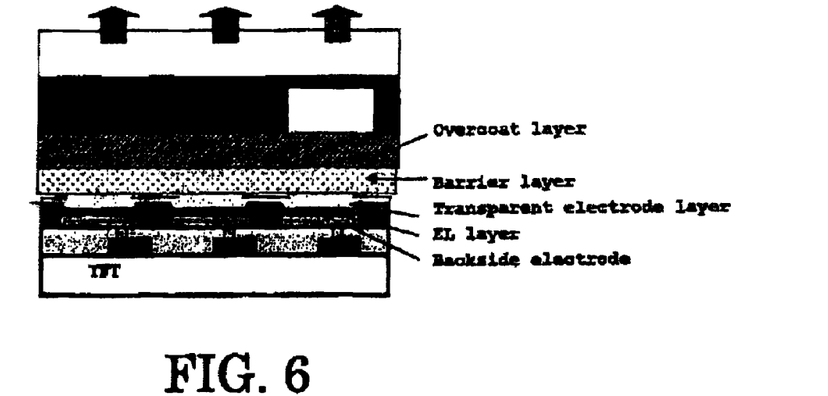
FIG. 6 is another diagram similar to FIG. 5, showing another alternative exemplary relationship.

FIGS. 1 and 2 show an embodiment of a production process of a color conversion member 10 for organic EL according to the present invention step by step. The production process is carried out in the order of FIG. 1 and FIG. 2.

As shown in FIG. 1(a), a transparent substrate 1 is provided, and a black matrix 2 is stacked on a surface (top in the drawing) of the transparent substrate 1. The black matrix 2 comprises a light shielding layer having openings corresponding to respective pixels. Methods usable for the formation of the black matrix 2 include a method wherein a light shielding material such as chromium (Cr) is vapor deposited onto the whole area of one side of a transparent substrate and the vapor deposited layer is then patterned by photolithography, a printing method using a resin composition containing a light-shielding pigment, and a method wherein the above resin composition is patterned by photolithography. The term "openings," when simply referred to in the present specification, means openings of the black matrix 2.

The presence of the black matrix 2 is preferred because the black matrix 2 can reduce the reflection of external light as viewed from the viewer side, can improve the contrast of images and pictures, and enables individual layers to be formed so as to correspond to the openings of the black matrix 2.

As shown in FIG. 1(*b*), a color filter layer 3 (G) is stacked on the transparent substrate 1 in its parts which, together with the black matrix 2, constitute openings respectively located second and fifth as counted from the left side of the drawing. The color filter layer 3 (G) is a color filter layer for a green color and functions to correct green light supplied from a color conversion layer provided on the color filter layer 3 (G). Fine color filter layers corresponding to respective openings of the black matrix 2 are sometimes referred to color filter layers. In fact, however, the fine color filter layers are collectively referred to as a color filter layer. In the individual layers which will be described below, the same is true of the presence or absence of "fine."

The color filter layer 3 (G) may be formed by providing a coating composition or ink composition colored with a predetermined color and photolithographically patterning the composition or printing the composition.

In the case of a full-color display, besides the color filter layer for a green color, a color filter layer for a red color or a color filter layer for a blue color may be formed. For the color filter layer for a blue color, when luminescence of the EL layer is blue light or blue light and green light, blue light is obtained without color conversion. In this case or when no particular correction is required, the provision of the color filter layer for a blue color may be omitted. Also for the color filter layer for a green color and a color filter layer for a red color, when the absence of these color filter layers is not an obstacle to the results of color conversion by the color conversion layer, these color filter layers may be omitted.

As shown in FIG. 1(*c*), a color conversion layer 4 (B) is formed, on the transparent substrate 1, with the black matrix 2 and the color filter layer 3 (G) for a green color formed thereon, on its parts which, together with the black matrix 2, constitute openings respectively located adjacent to the color filter layer 3 (G) for a green color, that is, located first and fourth as counted from the left side of the drawing. The color conversion layer 4 (B) is originally a blue color conversion layer which converts light supplied from the EL layer to blue light. When luminescence from the EL layer is blue light or blue light and green light, since the blue light is provided without color conversion, there is also no need to provide the blue color conversion layer for converting incident light to blue light. Since, however, the thickness of other color conversion layers is relatively large, when the blue color conversion layer is not provided, that portion becomes a concave part. As a result, the evenness of the thickness of the color conversion member as indicated by a reference number 10 in FIG. 2(*c*) is lost. For this reason, in general, preferably, a colorless transparent layer (clear layer) is stacked on the transparent substrate 1 in its parts. In the present specification, this construction including the case where the clear layer is formed will be sometimes referred to as a blue color conversion layer.

Therefore, when the color conversion layer 4 (B) is literally a blue color conversion layer, the blue color conversion layer may be formed by providing a resin composition containing an organic luminophor, which converts incident light to blue color, and photolithographically patterning the composition or printing the composition. The clear layer may be formed by providing a transparent resin composition free from the organic luminophor and photolithographically patterning the composition or printing the composition.

In the present specification, the description referring to FIGS. 1 and 2 is based on the assumption that a region for a blue color, a region for a green color, and a region for a red color are repeatedly arranged in that order on the transparent substrate 1 from the left side in the drawing. In the screen of an actual EL display, however, individual regions (fine regions) of these three primary colors may take various arrangements, for example, a stripe arrangement, a mosaic arrangement, and a triangular arrangement and may take any arrangement so far as the individual regions are macroscopically arranged on average.

As shown in FIG. 1(*d*), a color conversion layer 4 (G) is formed on the color filter layers 3 (G) which have already been formed in the openings located on the right side of the opening, in which the color conversion layer 4 (B) has been provided in the drawing, that is, located second and fifth as counted from the left side of the drawing. The color conversion layer 4 (G) is originally a green color conversion layer which converts light supplied from the EL layer to green light. The green color conversion layer 4 (G) may be formed by providing a resin composition containing an organic luminophor, which converts incident light to green light, and photolithographically patterning the composition or printing the composition. The color conversion layer 4 (B) and the color conversion layer 4 (G) are preferably formed so as to have the same thickness as each other.

When the color filter layer 3 (G) for a green color, the blue color conversion layer 4 (B), and the green color conversion layer 4 (G) are provided on the transparent substrate 1 in the above manner, a concave region is formed on the transparent substrate 1 in its part which, together with the black matrix 2, forms an opening located third as counted from the left side of the drawing. Further, a space may be formed between the blue color conversion layer 4 (B) and the green color conversion layer 4 (G) although the presence or absence varies depending upon the method for forming these layers or the accuracy of the formation of these layers.

As shown in FIG. 2(*a*), a color filter layer 3 (R) for a red color is provided, from the concave region-formed side of the transparent substrate 1, on the bottom and wall surface of the concave region, on the blue color conversion layer 4 (B), and on the green color conversion layer 4 (G) and within the space which may be possibly present.

Preferably, the color filter layer 3 (R) for a red color is provided on the bottom and wall surface of the concave region. Therefore, although the color filter layer 3 (R) for a red color may be formed by a photolithographic method or a printing method using a coating composition or an ink composition colored with a predetermined color, the use of a method which simply coats the color filter layer 3 (R) for a red color on the whole surface of the assembly without limination to the concave region is simple and preferred. Further, preferably, the color filter layer 3 (R) for a red color is formed to have substantially the same thickness as the color filter layer 3 (G) for a green color. The color filter layer 3 (R) for a red color can be easily formed by coating the layer on the whole area of the assembly. As will be described later, however, a red color conversion layer is further stacked, and the unnecessary portion of the color filter layer 3 (R) for a red color is removed together with the unnecessary portion of the red color conversion layer by polishing. In this case, when the color filter layer 3 (R) for a red color even in a very small amount remains unremoved on the blue color conversion layer 4 (B) or the green color conversion layer 4 (G), this phenomenon becomes an obstacle to a full-color display. Accordingly, from the viewpoint of surely removing the color filter layer 3 (R) for a red color in its unnecessary portion, preferably, photolithography is used. Specifically, the color filter layer 3 (R) for a red color is formed only substantially in the concave region, that is, is allowed to remain unremoved only on the bottom and the wall surface while removing the other portion by photolithography using a photomask which acts only on an area slightly larger than the width of the concave region. Also when the color filter layer 3 (R) for a red color is formed only on the bottom of the concave region, the use of the photolithographic method is preferred.

After stacking of the color filter layer 3 (R) for a red color, preferably, the color filter layer 3 (R) for a red color is solidified to such an extent that does not hinder the stacking of the next layer. Thereafter, a color conversion layer 4 (R) is filled into and provided on the concave region on which at least the color filter layer 3 (R) for a red color has been stacked (FIG. 2 (*b*)). The color conversion layer 4 (R) is originally a red color conversion layer which converts incident light supplied from the EL layer to red light.

Although the color conversion layer 4 (R) may also be formed by photolithography or printing using a resin composition containing an organic luminophor which converts incident light to red light, here again, mere coating of the composition on the whole area of the assembly without limitation on the concave region is simple and is preferred.

In the laminate thus obtained, the color filter layer 3 (R) for a red color formed on the area other than the bottom and wall surface of the concave region is unnecessary in the final stage, and the color conversion layer 4 (R) stacked on the area other than the concave region is also unnecessary. In FIG. 2(*b*), a portion above from the top surface of the color conversion layer 4 (B) and a portion above from the top surface of the color conversion layer 4 (G), that is, a portion from above a dotted line 5 which is indicated to cover that portions, is unnecessary.

The portion above from the dotted line 5 of this laminate is removed by polishing to form a color conversion member 10 for an EL display as shown in FIG. 2(*c*) in which the black matrix 2 is stacked on the transparent substrate 1 having openings; only the blue color conversion layer 4 (B), which may be actually a clear layer, is stacked on the transparent substrate 1 in its parts which, together with the black matrix 2, form openings corresponding to the blue color region; in the green color region, the color filter layer 3 (G) for a green color and the green color conversion layer are simply stacked in that order from the black matrix 2 side; in the red region, the red color conversion layer 4 (R) is stacked through the color filter layer 3 (R) for a red color stacked on transparent substrate and on the both wall surfaces of the color conversion layers provided adjacent to the red region; and the color filter layer 3 (R) for a red color is stacked within the space which may be formed between the blue color conversion layer 4 (B) and the green color conversion layer 4 (G).

In FIGS. 2(*b*) and (*c*), the removal of the portion from above the dotted line 5 has been described. In connection with the removal, the following means may also be adopted. The color conversion layers 4 (B), 4 (G), and 4 (R) are actually stacked while leaving a space around the peripheral part of the transparent substrate. Therefore, as described above, when the color filter layer 3 (R) for a red color is stacked on the substrate in its concave region which is defined by the substrate and the black matrix, followed by filling of the color conversion layer 4 (R) into the concave region, in the space part to be free from the color conversion layer 4 (B) and the color conversion layer 4 (G), these two layers are disadvantageously stacked on the transparent substrate 1. The two layers stacked on the transparent substrate 1 in its parts to be free from the two layers cannot be sometimes removed by mere polishing. In this case, a method may be adopted wherein a photoresist layer having the same height as the color conversion layer 4 (B) and the color conversion layer 4 (G) is previously provided on the transparent substrate 1 in its parts to be free from the color conversion layers 4 (B), 4 (G), and 4 (R) so that, in the application of the color filter layer 3 (R) for a red color and the color conversion layer 4 (R), even when these two layers are also applied onto the photoresist layer, these two layers on the photoresist layer provided in the space parts can also be removed by polishing. The photoresist layer remaining unremoved can be if necessary removed by dissolution or the like.

The above color conversion member is a color conversion member for an EL display in which a color filter layer 3 (R) for a red color is provided on the transparent substrate 1 side of the red color conversion layer 4 (R) and a portion between the red color conversion layer 4 (R) and each of the color conversion layers adjacent to the red color conversion layer 4 (R) (this color conversion member for an EL display will be hereinafter referred to as "embodiment 1" of the present invention). The color conversion member for an EL display according to the present invention, however, includes an embodiment in which a color filter layer 3 (G) for a green color is stacked on the transparent substrate side of the green color conversion layer 4 (G) and a portion between the green color conversion layer 4 (G) and each of the color conversion layers adjacent to the green color conversion layer 4 (G) (this color conversion member for an EL display will be hereinafter referred to as "embodiment 2" of the present invention). In embodiment 1, the provision of the color filter layer 3 (R) for a red color on the transparent substrate 1 side of the red color conversion layer 4 (R) and the portion between the red color conversion layer 4 (R) and each of the color conversion layers adjacent to the red color conversion layer 4 (R) can avoid the influence, on the green color conversion layer, of light leaked from the blue color conversion layer (clear layer in many cases) into the red color conversion layer. In some cases, however, there is a still influence, on the green color conversion layer, of light leaked from the blue color conversion layer into the green color conversion layer. Therefore, preferably, a color filter layer for a green color is provided on the blue color conversion layer side of the green color conversion layer. When the color filter layer for a green color is stacked on the transparent substrate side of the green color conversion layer, the color filter layer for a green color is preferably provided on a portion including the blue color conversion layer side of the green color conversion layer. It is a matter of course that the color filter layer for a green color may be stacked on the transparent substrate side of the green color conversion layer and a portion between the green color conversion layer and each of the color conversion layers adjacent to the green color conversion layer. When the green color conversion layer is stacked on a limited site, the use of photolithography is preferred.

In embodiment 2, a color conversion member for an EL display is constructed in such a manner that a black matrix 2 having openings is stacked onto a transparent substrate 1, a blue color conversion layer, which may be actually a clear layer, is stacked on the transparent substrate 1 in its parts which, together with the black matrix 2, define openings for a blue color region; in a green color region, a green color conversion layer is stacked through a color filter layer for a green color on the transparent substrate and a portion between the green color conversion layer and each of the color conversion layers adjacent to the green color conversion layer; in a red color region, a red color conversion layer, usually together with a color filter layer for a red color, is stacked from the black matrix 2 side; and the color filter layer for a green color is also provided on (actually is filled into) the space which may be formed between the blue color conversion layer and the red color conversion layer. Preferably, a color filter layer for a red color is provided on the blue color conversion layer side of the red color conversion layer.

If necessary, for example, elements for constituting an EL element may be provided on the color conversion member for an EL display, according to the present invention, in its side where the color conversion layers have been stacked, whereby an EL display can be prepared. In this case, the elements for constituting an EL element are provided through an overcoat provided on the whole area of the color conversion layer-formed side.

The EL element basically comprises a transparent electrode layer, an EL layer, and a backside electrode layer provided in that order as viewed from the color conversion layer side so as to correspond to each of the fine color conversion layer. The drive system may be either a passive matrix system or an active matrix system. If necessary, a sealing material and a substrate different from that used in the color conversion member for an EL display may also be stacked.

In the color conversion member for an EL display in embodiment 1, in an actual case, usually, the blue color region is a clear layer, the green color region comprises a green color conversion layer and a color filter layer for a green color, and, in the red color region, the red color conversion layer is provided through a color filter layer for a red color on the transparent substrate side and on both color conversion layer sides. The color conversion member for an EL display in embodiment 1 is most preferably used in combination with an EL element which emits blue light and green light.

In the combination of the color conversion member for an EL display in embodiment 1 with an EL element capable of emitting blue light and green light, for blue light, there is no need to perform color conversion. In an actual case, the blue color conversion layer constituted as a clear layer contains no organic luminophor for color conversion, and, thus, no deterioration takes place. The provision of a color filter layer for a blue color can cut off green light transmitted through the clear layer. The green color conversion layer contains an organic luminophor for color conversion and undergoes a deterioration. Even when the green color conversion layer causes a lowering in the color conversion function due to its deterioration, green light in the incident light as such is passed through the green color conversion layer. Therefore, a lowering in quantity of output green light can be compensated, and, thus, the lowering in quantity of output green light is less likely to pose a practical problem. On the other hand, the red color conversion layer contains an organic luminophor for color conversion and thus undergoes its deterioration, and, in addition, even when incident light is passed through the red color conversion layer as in the case of the green color conversion layer, since no red light component is contained, the quantity of output red light is lowered.

Therefore, when the color conversion member for an EL display in embodiment 1 is used in combination with an EL element capable of emitting blue light and green light, the red color conversion layer in the color conversion member for an EL display is most likely to be deteriorated among the color conversion layers. In this case, when a red color filter layer is provided between the red color conversion layer and each of the other color conversion layers adjacent to the red color conversion layer, a deterioration in the red color conversion layer by light leaked from the color conversion layers adjacent to the red color conversion layer can be suppressed, because the red color filter layer does not transmit blue light having high energy in the visible region.

1. Transparent Substrate

The transparent substrate is a support for supporting a color conversion member for an EL display. When an EL display is constructed, the support is located on the viewer side and serves also as a support for supporting the whole organic display.

Transparent substrates are classified roughly into plate-shaped transparent substrates of inorganic materials such as glass and quartz glass, plate-shaped transparent substrates of organic materials, for example, synthetic resins such as acrylic resins, and transparent film substrates of synthetic resins. Very thin glass may also be utilized as the transparent film substrate. Preferably, the transparent substrate on its surface, where color conversion layers and the like are provided, has a high level of smoothness, that is, has an average roughness (Ra) of 0.5 to 3.0 nm (5 μm square region).

Specific examples of synthetic resins usable for constituting the transparent substrate include polycarbonate resins, polyallylate resins, polyethersulfone resins, acrylic resins such as methyl methacrylate resins, cellulosic reisns such as triacetylcellulose resins, epoxy resins, cyclic olefin resins, and cyclic olefin copolymer resins.

2. Color Conversion Layers

The color conversion layers are provided so as to correspond to openings of the black matrix and the color filter layer. Three color conversion layers, i.e., a color conversion layer for a blue color, a color conversion layer for a green color, and a color conversion layer for a red color, are regularly arranged respectively for individual pixels. For the color conversion layer for a blue color among these color conversion layers, when the EL element inherently emits blue light or (blue light/green light), in principle, there is no need to perform color conversion. Therefore, the provision of no color conversion layer for the blue color is required. As described above, however, preferably, a clear layer having the same thickness as the color conversion layers for the other colors is formed as a dummy layer.

As with each color part of the color filter layer, each color part of the color conversion layer may be provided only in the opening part of the black matrix. Alternatively, as shown in FIG. 1 or 2, the color conversion layer may be provided in a strip form from the front side toward the rear side or may be provided so as to correspond to the openings of the black matrix.

The red color conversion layer may be formed using a composition comprising a luminophor, capable of converting a blue color to a red color, dissolved or dispersed in a resin, and the green color conversion layer may be formed using a composition comprising a luminophor, capable of converting a blue color to a green color, dissolved or dispersed in a resin.

Red Color Conversion Luminophor

Specific examples of red color conversion luminophors include fluorescent dyes and fluorescent pigments, for example, cyanine dyes such as 4-dicyanomethylene-2-methyl-6-(p-dimethylaminostyryl)-4H-pyran, pyridine dyes such as 1-ethyl-2-[4-(p-dimethylaminophenyl)-1,3-butadienyl]-pyridium-perchlorate, rhodamine dyes such as Rhodamine B or Rhodamine 6G, oxazine dyes, and ZnS:Mn, ZnS:Mn/ZnMgS, and orange pigments (for example, FA 001 (tradename), manufactured by Sinloihi Co., Ltd.).

Green Color Conversion Luminophor

Specific examples of green color conversion luminophors include fluorescent dyes or fluorescent pigments, for example, coumarin dyes such as 2,3,5,6-1H,4H-tetrahydro-8-trifluoromethylquinolizino(9,9a,1-gh)coumarin, 3-(2'- benzothiazolyl)-7-diethylaminocoumarin, or 3-(2'-benzimidazolyl)-7-N,N-diethylaminocoumarin, coumarin dyes such as Basic Yellow 51, or naphthalimide dyes such as Solvent Yellow 11 or Solvent Yellow 116, ZnS:Tb, and yellowish green pigments (for example, FA 005 (tradename), manufactured by Sinloihi Co., Ltd.).

Resin

Specific examples of resins for dissolving or dispersing the red color conversion luminophor or the green color conversion luminophor include transparent resins such as polymethyl methacrylate resins, polyacrylate resins, polycarbonate resins, polyvinyl alcohol resins, polyvinyl pyrrolidone resins, hydroxyethylcellulose resins, carboxymethylcellulose resins, polyvinyl chloride resins, melamine resins, phenolic resins, alkyd resins, epoxy resins, polyurethane resins, polyester resins, maleic resins, or polyamide resins. Additional specific examples of resins usable herein include reactive vinyl-containing ionizing radiation-curable resins such as acrylate resins, methacrylate resins, polyvinyl cinnamate resins, and cyclized rubbers. In electron beam-curable resins and ultraviolet-curable resins, in fact, the latter is in many cases used.

The color conversion layer may be formed by photolithography. Alternatively, the color conversion layer may be formed by mixing the above red color conversion luminophor or the green color conversion luminophor and the resin optionally with a solvent, a diluent, or suitable additives to prepare an ink composition and printing the ink composition. The clear layer for a blue color may be formed in the same manner as described above, except that the red color conversion fluorescent dye or the green color conversion fluorescent dye is removed from the composition or ink composition used. The ratio between the resin in the color conversion layer and the red color conversion luminophor or the green color conversion luminophor is preferably approximately 100:0.3 to 100:5 in terms of the ratio of the resin to the luminophor on a mass basis. The thickness of the color conversion layer is preferably about 5 to 20 μm. Preferably, the color conversion layer is filled into the concave region in the same manner as in the formation of the color filter layer in the concave region, that is, by a method which can realize a relatively large coverage, such as a coating method or a method in which the composition or ink composition can be discharged through a dispenser. As in the color conversion layer (R), when filling into the concave region is required, the formation of the layer in a large thickness is preferred from the viewpoint of ensuring the thickness of the polished color conversion layer (R) so as to be the same thickness as the other color conversion layers.

Preferred polishing methods include, for example, sand paper comprising proper abrasive particles spread on and adhered to a sheet, and, further, chemical polishing, mechanical polishing, and a combination of chemical polishing with mechanical polishing, that is, mechanochemical polishing ("MCP": known also as chemical-mechanical polishing "CMP"). The chemical polishing method is carried out by feeding a liquid having an etching property as an abrasive to an abrasive member such as cloth, a nonwoven fabric or a foam of polyurethane resin or the like. Mechanical polishing methods include, for example, a method in which an abrasive member, such as cloth, a nonwoven fabric or a foam of polyurethane resin or the like, impregnated with an abrasive such as fine powder of colloidal silica or cerium oxide, and a method in which polishing is carried out by feeding a dispersion of colloidal silica or cerium oxide.

In any event, preferably, a method is adopted wherein, while relatively moving the object and the abrasive member, for example, by rotating the object, the abrasive member is brought into contact with the color conversion layer stacked on the surface part of the assembly, if necessary, in such a state that an abrasive is supplied. This polishing is *carried out at least to such an extent that the height of the color conversion layer filled into the concave region is brought to the same height as the other color conversion layers. When the color conversion layer and the color filter layer filled into the concave region, have also been stacked on other color conversion layers, preferably, the portion including these layers are reliably removed by polishing.

3. Color Filter Layer

The color filter layer is provided so as to correspond to openings in the black matrix. Three types of color filter layers, a color filter layer for a blue color, a color filter layer for a green color, and a color filter layer for a red color, are regularly arranged respectively for individual pixels. Individual color parts of the color filter layer may be provided in respective openings in the black matrix. For convenience, each color part may be provided in a strip form from the front side toward the rear side in FIG. 1 or 2. In the CCM-type EL display, blue light emitted from a layer in the EL element is converted by the color conversion layer to three primary color lights of blue light, green light, and red light. This can realize the reproduction of color pictures. However, the provision of a color filter layer is preferred from the viewpoint of further correcting these lights to allow only lights falling within a predetermined band to be transmitted, thereby enhancing color rendering properties of the EL display.

The color filter layer may be formed by photolithography. Alternatively, the color filter layer may be formed by preparing an ink composition colored with a predetermined color and printing the ink composition for each color. The thickness of the color filter layer 3 is about 1 to 2 μm. When the color filter layer is provided from the bottom of the concave region toward the wall surface, preferred is a method which can realize a relatively large coverage, such as a coating method or a method in which the composition or ink composition can be discharged through a dispenser.

4. Black Matrix

According to the present invention, preferably, a black matrix is formed on the transparent substrate. The black matrix is formed for providing, by partitioning, light emitting regions for respective pixels and preventing the reflection of external light in boundaries between light emitting regions to enhance the contrast of image and pictures. In general, the black matrix is formed in a pattern form having openings, for example, in a vertical and lateral grid formed of black fine lines or in such a form that a grid is formed only in one direction. Luminescence of the EL display is passed through the openings of the black matrix and reaches the viewer side.

In the formation of the black matrix, at the outset, the transparent substrate is thoroughly cleaned, and a thin metal layer is then formed using a metal such as chromium on the transparent substrate by various methods such as vapor deposition, ion plating, or sputtering. In this case, when optical density high enough to shield light, cleaning resistance, working properties, etc. are taken into consideration, a thin metal layer of chromium is most preferred. For example, conventional photolithography may be utilized for the formation of the black matrix from the formed thin metal layer. The black matrix may be formed, for example, by coating a photoresist onto the surface of the formed thin metal layer, covering the photoresist with a pattern mask, and subjecting the assembly to various steps such as exposure, development, etching, and washing.

The black matrix may also be formed by an electroless plating method, a printing method using a black ink composition or the like. The thickness of the black matrix is about 0.2 to 0.4 μm in the case of the thin layer, and is about 0.5 to 2 μm in the case of the layer formed by the printing method.

The photolithography mentioned as one method for forming the black matrix can also be utilized for the formation of individual color filter layers and for the formation of individual color conversion layers including the clear layer. The photolithography may be carried out by a method in which a composition for the formation of each layer is applied on the whole area, the coating is once solidified, and a photoresist is then applied for patterning of the coating, or a method in which a composition for the formation of each layer is prepared using a photosensitive resin composition and is applied to directly form the black matrix.

5. Overcoat

In the present invention, preferably, an overcoat is formed. Various layers are formed on the overcoat, and the overcoat functions to shield the EL layer from the underlying layers, particularly the color conversion layers which are likely to adversely affect the service life of the EL layer.

The overcoat is formed of a transparent resin. Specific examples of resins usable herein include those described above in connection with the resins usable for constituting the color conversion layers. The overcoat may be formed by a method in which the resin is mixed optionally with a solvent, a diluent, or a monomer or the like and, in addition, with suitable additives to prepare a photosensitive resin composition, the photosensitive resin composition is then evenly coated, and the coating is dried and is then irradiated with an ionizing radiation to cure the coating, or a method in which a conventional coating composition, which is not curable by an ionizing radiation, is prepared, the coating composition is then coated by suitable coating means, and the coating is then dried. The thickness of the overcoat is preferably 1 to 5 μm although the suitable thickness varies depending upon the roughness of the underlying layer, and the overcoat is formed so that the surface of the overcoat has a high level of smoothness.

6. Transparent Barrier Layer

A transparent barrier layer may be provided between the overcoat and a transparent electrode layer. The transparent barrier layer is preferably formed of a thin film of an inorganic oxide and can prevent air, particularly water vapor, from being transmitted, from below, to the overlying EL layer. Preferred inorganic oxides include silicon oxide, aluminum oxide, titanium oxide, or silicon nitride or alloys of silicon oxide with silicon nitride. The thickness of the transparent barrier layer is about 0.03 to 3 μm.

Use of Color Conversion Member

The color conversion member according to the present invention can be utilized particularly in EL displays using an EL element. The EL element generally comprises a transparent electrode layer, a luminescent layer, and a backside electrode layer.

A. Transparent Electrode Layer

The transparent electrode layer is provided to apply voltage to the EL layer sandwiched between the transparent electrode layer and the backside electrode layer and thus to cause luminescence at a predetermined position. For example, as shown in FIG. 1 or 2, individual electrodes in a strip having a width corresponding to the width of the opening of the black matrix are disposed in the horizontal direction in the drawing and are arranged from the front side toward the rear side in the drawing at predetermined spacings. The arrangement pitch of the transparent electrodes is identical to the arrangement pitch of the openings of the black matrix.

The transparent electrode layer is formed of a transparent and electrically conductive thin film of a metal oxide. Metal oxides as the material include, for example, indium tin oxide (ITO), indium oxide, zinc oxide, and stannic oxide. After the formation of an even thin film of the material, preferably, unnecessary parts are removed by photolithography to form the transparent electrode.

B. EL Layer

The EL layer is a layer which emits light of a single color or a composite color, and the luminophor for forming the luminescent layer may be either an inorganic luminophor or an organic luminophor and may have any color without particular limitation. That is, in the present invention, any luminophor may be used for providing a desired luminescent color. Further, the luminescent layer may have any of a single-color structure or a multi-color structure.

Inorganic Luminophor

For inorganic luminophors for forming the EL layer according to the present invention, inorganic materials of existing red, green, and blue colors as basic colors are used, and other multicolor inorganic materials may be used. They may be those in current use. Specific examples of preferred inorganic luminophors include blue color fluorescent materials, for example, thiogallate or thioaluminate blue luminophors having excellent color purity such as $SrGa_2S_4$:Ce, $CaGa_2S_4$:Ce, and $BaAl_2S_4$:Eu proposed in Japanese Patent Laid-Open Nos. 122364/1995 and 134440/1996. Further, orange pigments (for example, FA 001 (tradename), manufactured by Sinloihi Co., Ltd.), yellowish green pigments (for example, FA 005 (tradename), manufactured by Sinloihi Co., Ltd.) and the like may also be preferably utilized.

Organic Luminophor

For organic luminophors for forming the EL layer according to the present invention, organic materials of existing red, green, and blue colors as basic colors are used, and other multicolor organic materials may be used. They may be those in current use.

Specific examples of organic luminophors, which can emit lights of colors ranging from blue to blue-green, include benzothiazole, benzimidazole, benzoxazole and other fluorescent brightening agents exemplified in Japanese Patent Laid-Open No. 279394/1996, metal chelated oxynoid compounds disclosed in Japanese Patent Laid-Open No. 295695/1988, styrylbenzene compounds disclosed in European Patent Nos. 0319881 and 0373582,distyrylpyrazine derivatives disclosed in Japanese Patent Laid-Open No. 252793/1990, and aromatic dimethylidene compounds disclosed in Europe Patent No. 0388768 and Japanese Patent Laid-Open No. 231970/1991.

Specific examples of benzothiazole fluorescent brightening agents include 2-2'-(p-phenylenedivinylene)-bisbenzothiazole. Specific examples of benzimidazole fluorescent brightening agents include 2-[2-[4-(2-benzimidazolyl)phenyl]vinyl]benzimidazole or 2-[2-(4-carboxyphenyl)vinyl]benzimidazole. Specific examples of benzoxazole fluorescent brightening agents include 2,5-bis(5,7-di-t-pentyl-2-benzoxazolyl)-1,3,4-thiadiazole, 4,4'-bis(5,7-t-pentyl-2-benzoxazolyl)stilbene, or 2-[2-(4-chlorophenyl)vinyl]naphtho[1,2-d]oxazole.

Examples of metal chelated oxynoid compounds include 8-hydroxyquinoline metal complexes such as tris(8-qunolinol)aluminum, bis(8-qunolinol)magnesium, bis(benz[f]-8-quinolinol)zinc, or dilithiumepinetridione. Examples of styrylbenzene compounds include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, or 1,4-bis(2-methylstyryl)-2-ethylbenzene.

Examples of distyrylpyrazine derivatives include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine. Examples of aromatic dimethylidene compounds include 1,4-phenylenedimethylidene, 4,4-phenylenedimethylidene, 2,5-xylenedimethylidene, 2,6-naphthylenedimethylidene, 1,4-biphenylenedimethylidene, 1,4-p-terephenylenedimethylidene, 9,10-anthracendiylzylmethylidene, 4,4'-bis(2,2-di-t-butylphenylvinyl)biphenyl, 4,4'-bis(2,2-diphenylvinyl)biphenyl, or derivatives thereof.

Specific examples of organic luminophors for constituting the luminescent layer capable of emitting blue light include compounds represented by formula (Rs-Q)2-AL-O-L, wherein L represents a benzene ring-containing hydrocarbon having 6 to 24 carbon atoms, O-L represents a phenylate ligand, Q represents a substituted 8-quinolinolate ligand, and Rs represents an 8-quinolinolate ring substituent selected so as to sterically hinder binding of two or more substituted 8-quinolinolate ligands to the aluminum atom, described, for example, in Japanese Patent Laid-Open No. 258862/1993.

Specific examples thereof include bis(2-methyl-8-quinolinolate) (p-phenylphenolate)aluminum(III) or bis(2-methyl-8-quinolinolate)(1-naphtholate)aluminum(III).

The thickness of the EL layer is not particularly limited. For example, the thickness of the EL layer may be about 5 nm to 5 µm.

Optional Layer

The EL layer may be typically constituted only by a luminescent layer containing the above luminophor. If necessary, however, the following layers may be further included. Specifically, in the case of the organic luminescent layer, a hole injection layer may be provided on the transparent electrode layer side of the luminescent layer, or alternatively an electron injection layer may be provided on the backside electrode layer side of the luminescent layer. In the case of the inorganic luminescent layer, an insulating layer may be provided on both sides of the luminescent layer.

Hole Injection Layer

The material for constituting the hole injection layer may be properly selected from materials which have hitherto been used as hole injection materials for electrically nonconductive material, and conventional materials which have been used for hole injection layers in EL elements. The material may have either hole injection properties or electron barrier properties and may be either an organic material or an inorganic material.

Specific examples of materials usable for constituting the hole injection layer include electrically conductive polymeric oligomers such as triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilanes, aniline copolymers, or thiophene oligomers. Additional materials for the hole injection layer include porphyrin compounds, aromatic tertiary amine compounds, or styrylamine compounds.

Specific examples of porphyrin compounds include porphin, 1,10,15,20-tetraphenyl-21H,23H-porphin copper(II), aluminum phthalocyanine chloride, or copper octamethylphthalocyanine. Specific example of aromatic tertiary amine compounds include N,N,N',N'-tetraphenyl-4,4'-diaminophenyl, N,N'-diphenyl-N,N'-bis-(3-methylphenyl)-[1,1'-biphenyl]-4,4'-diamine, 4-(di-p-tolylamino)-4'-[4-(di-p-tolylamino)styryl]stilbene, 3-methoxy-4'-N,N-diphenylaminostilbene, 4,4'-bis[N-(1-naphthyl)-N-phenylamino]biphenyl, or 4,4',4"-tris[N-(3-methylphenyl)-N-phenylamino]triphenylamine.

The thickness of the hole injection layer is not particulary limited. However, the thickness of the hole injection layer may be, for example, about 5 nm to 5 µm.

Electron Injection Layer

Specific examples of materials for constituting the electron injection layer include nitro-substituted fluorene derivatives, anthraquinodimethane derivatives, diphenylquinone derivatives, thiopyrandioxide derivatives, heterocyclic tetracarboxylic acid anhydride such as naphthaleneperylene, carbodiimide, fluorenylidenemethane derivatives, anthraquinodimethane and anthrone derivatives, oxadiazole derivatives, or thiazole derivatives provided by replacing the oxygen atom in an oxadiazole ring of an oxadiazole derivative with a sulfur atom, quinoxaline derivatives having a quinoxaline ring known as an electron-withdrawing group, metal complexes of 8-quinolinol derivatives such as tris(8-quinolinol)aluminum, phthalocyanine, metal phthalocyanines, or distyrylpyrazine derivatives.

The thickness of the electron injection layer is not particularly limited. However, the thickness of the electron injection layer may be, for example, about 5 nm to 5 µm.

Insulating Layer

Specific examples of materials for constituting the insulating layer utilized in the case of the inorganic luminescent layer include nitrides such as $Si_3N_4R$ and AlN, oxides such as $SiO_2$, $Ta_2O_5$, $Al_2O_3$, $Y_2O_3$, $TiO_2$, $BaTiO_3$, $BaTa_2O_6$, $PbNb_2O_6$, $PbTiO_3$, $PbZrO_3$, and $SrTiO_3$, or mixtures thereof. The thickness of the insulating layer is not particularly limited. However, the thickness of the insulating layer may be, for example, about 1 µm to 1000 µm.

C. Backside Electrode Layer

The backside electrode layer constitutes the other electrode for emitting light from the EL layer. The backside electrode layer is formed of a metal, an alloy, or a mixture thereof which has a small work function of about 4 eV or less. Specific examples thereof include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, or lithium/aluminum mixtures, and rare earth metals. More preferred are magnesium/silver mixtures, magnesium/aluminum mixtures, magnesium/indium mixtures, aluminum/aluminum oxide ($Al_2O_3$) mixtures, or lithium/aluminum mixtures.

Preferably, the backside electrode layer has a sheet resistance of not more than several hundreds ohms/cm. The thickness of the backside electrode layer is preferably about 10 nm to 1 µm, more preferably about 50 to 200 nm.

In addition, the EL element may further comprise an insulating layer on the transparent electrode layer so as to correspond to the black matrix. Further, a barrier, which can function as a mask in the formation of the EL layer and the backside electrode layer by a vapor phase method such as vapor deposition, may be provided on the insulating layer.

The invention claimed is:

1. A color conversion member comprising a transparent substrate, two or more types of color conversion layers, and a color filter layer,
   said color conversion layers functioning to convert incident lights for respective pixels to outgoing lights of colors different from the incident lights, said two or more types of color conversion layers being arranged on said transparent substrate, any one of the color conversion layers have a stepped convex surface; and said color filter layer being provided on the transparent substrate side of said any one of the color conversion layers and between said any one of the color conversion layers and the color conversion layers adjacent to said any one of the color conversion layers.

2. The color conversion member according to claim 1, wherein, another color filter layer is provided on the transparent substrate side of another one of the color conversion layers.

3. The color conversion member according to claim 1, wherein a black matrix having openings is further provided on the transparent substrate and said color conversion layers are provided in the openings.

4. The color conversion member according to claim 1, wherein said two or more types of the color conversion layers comprise a first color conversion layer for converting incident light of blue color and/or green color to outgoing light of red color, a second color conversion layer for converting said incident light to outgoing light of green color, and a light transparent layer for transmitting said incident light as such, and a color filter layer for a red color is provided on the transparent substrate side of the first color conversion layer or between the first color conversion layer and other color conversion layers adjacent to the first color conversion layer.

5. The color conversion member according to claim 4, wherein a color filter layer for a green color is further provided on the transparent substrate side of the second color conversion layer.

6. The color conversion member according to any one of claims 1 to 5, which is used in an EL display.

7. An EL display comprising the color conversion member according to any one of claims 1 to 5 and a luminescent part comprising a transparent electrode layer, an EL layer, and a backside electrode layer, said luminescent part being provided on the color conversion layers so as to correspond to each of the color conversion layers.

8. The EL display according to claim 7, wherein said luminescent part is provided through an n overcoat on said color conversion layers in said color conversion member.

9. The color conversion member comprising according to claim 1, wherein any one of the color filter layers have a convex surface.

10. A color conversion member comprising a transparent substrate; two or more types of color conversion layers, and a color filter layer, the color conversion layers functioning to convert incident lights for respective pixels to outgoing lights of colors different from the incident lights, said two or more types of color conversion layers being arranged on said transparent substrate, any one of the color conversion layers have a stepped convex surface toward the transparent substrate, and the color filter layer being provided on the transparent substrate side of said any one of the color conversion layers and between said any one of the color conversion layers and the color conversion layers adjacent to said any one of the color conversion layers, and the color filter layer comprising a stepped convex surface toward the transparent substrate.

* * * * *